United States Patent [19]

Sundaresan

[11] Patent Number: 4,628,589
[45] Date of Patent: Dec. 16, 1986

[54] METHOD FOR FABRICATING STACKED CMOS STRUCTURES

[75] Inventor: Ravishankar Sundaresan, Dallas, Tex.

[73] Assignee: Texas Instruments Incorporated, Dallas, Tex.

[21] Appl. No.: 656,056

[22] Filed: Sep. 28, 1984

[51] Int. Cl.$^4$ .......................................... H01L 21/385
[52] U.S. Cl. ..................... 29/571; 29/576 J; 148/188; 148/191; 357/42
[58] Field of Search ............... 29/571, 576 J; 148/188, 148/191; 357/42

[56] References Cited

U.S. PATENT DOCUMENTS

| | | | |
|---|---|---|---|
| B 988,181 | 10/1976 | Imah et al. | 148/188 |
| 3,899,373 | 8/1975 | Antipov | 148/188 X |
| 4,239,559 | 12/1980 | Ito | 148/188 |
| 4,467,518 | 8/1984 | Bansal et al. | 29/571 |
| 4,488,348 | 12/1984 | Jolly | 29/571 |
| 4,502,202 | 3/1985 | Malhi | 29/571 |
| 4,505,024 | 3/1985 | Kawate et al. | 29/571 |

Primary Examiner—George T. Ozaki
Attorney, Agent, or Firm—Kenneth C. Hill; James T. Comfort; Melvin Sharp

[57] ABSTRACT

In stacked CMOS, a single gate in first level polysilicon is used to address both an n-channel device in the substrate and an overlayed p-channel device. To self-align the p-channel polycrystalline silicon device to the gate, a layer of polycrystalline silicon is deposited over the integrated circuit, followed by spinning on a layer of doped oxide which is then etched back to expose the polycrystalline silicon over the gate region. Thermally annealing the integrated circuit causes dopant from the doped layer to diffuse into the polycrystalline layer, thereby forming self-aligned source and drain structures.

8 Claims, 4 Drawing Figures

METHOD FOR FABRICATING STACKED CMOS STRUCTURES

BACKGROUND AND SUMMARY OF THE INVENTION

The present invention relates to CMOS integrated circuits, i.e., to integrated circuits containing both N-channel and P-channel insulated gate field effect devices.

It is widely recognized in the art that it would be highly desirable to achieve practical stacked CMOS integrated circuits, i.e., circuits where a single gate at a single location is capacitively coupled to control both N-channel and P-channel devices. It is usually assumed that the N-channel devices would be formed in the substrate and the P-channel devices would be formed in polysilicon, although this is not strictly necessary.

Stacked CMOS has the potential to provide extremely dense integrated circuits, and especially to provide extremely dense memory circuits. However, known methods for fabrication of stacked CMOS structures do not permit the overlayed device to be self-aligned. That is, the mask which is used to pattern the channel region of the overlayed polysilicon is applied in a separate masking step from the patterning of the gate which must address this channel. This means that small geometry devices become infeasible, since misalignment between the gate and channel region would introduce a disastrous spread in device characteristics. The source-to-gate and drain-to-gate overlap capacitances are increased if the overlayed device is not self-aligned.

A stacked CMOS structure is described by S. Malhi in U.S. application No. 505,155, filed June 17, 1983, and assigned to the assignee of the present application, now issued as U.S. Pat. No. 4,502,202, entitled "Method for Fabricating Overlaid Device in Stacked CMOS". The method described therein is not fully self-aligned, resulting in higher overlap capacitances.

Thus it is an object of the present invention to provide a method for fabricating stacked CMOS integrated circuits wherein an overlayed polysilicon device has a channel region which is fully self-aligned to a gate electrode beneath the channel region.

Thus, according to the present invention, a gate oxide is formed over the gate region, followed by a layer of polycrystalline silicon. A doped layer is formed over the polycrystalline silicon layer, and etched back to expose the polycrystalline silicon over the gate region. Annealing the integrated circuit in an inert ambiant causes dopant to diffuse from the doped layer into the polycrystalline silicon, thereby forming heavily doped source and drain regions within the polycrystalline silicon, and separated by a less heavily doped channel region directly above the gate region.

The novel features which characterize the present invention are defined by the appended claims. The foregoing and other objects and advantages of the present invention will hereinafter appear, and for purposes of illustration, but not of limitation, a preferred embodiment is described in the accompanying drawings.

BRIEF DESCRIPTION OF THE DRAWINGS

FIGS. 1-4 are not drawn to scale, in order to more easily illustrate certain aspects of the present invention.

DESCRIPTION OF THE PREFERRED EMBODIMENT

Figure 1:
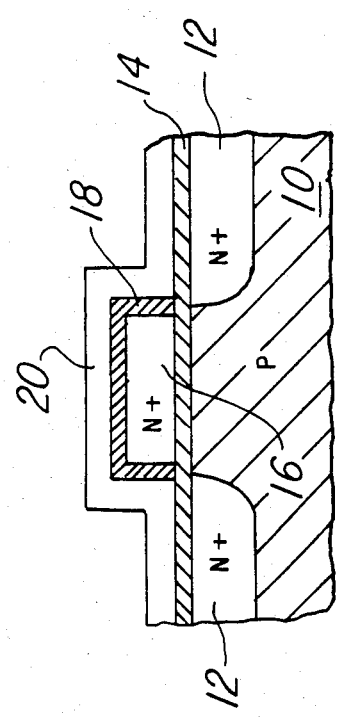

Referring to FIG. 1, a substrate 10 contains diffused source and drain regions 12. The substrate 10 is preferably doped P-type, and may actually be an integrated circuit substrate or a region, such as a p-well, defined within an integrated circuit substrate and isolated from other similar wells by conventional methods. A thin gate oxide 14 overlies the surface of the substrate 10. A gate region 16 lies atop the gate oxide 14, and is preferably formed from doped polycrystalline silicon (e.g. doped n+).

The structure described thus far can be fabricated by any conventional process. Now, a thin gate oxide 18 is grown on the gate 16, followed by a layer 20 of polycrystalline silicon. The layer of polycrystalline silicon will conform to the contours of the interlying oxide layers as shown in FIG. 1.

Figure 2:
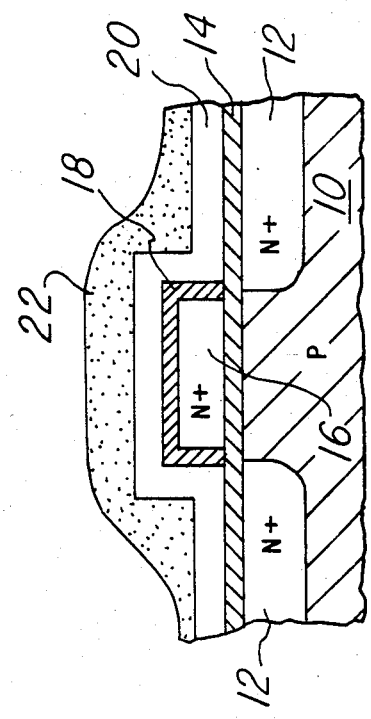

Referring to FIG. 2, a doped layer 22 is formed over the polycrystalline silicon layer 20. The doped layer 22 is preferably boron doped silicate glass, which is spun onto the integrated circuit using conventional techniques.

Figure 3:
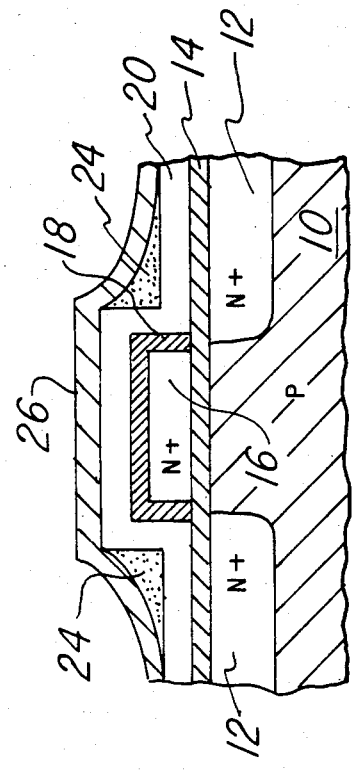
FIGS. 1-4 illustrate a preferred method for fabricating stacked CMOS integrated circuits according to the present invention.
Figure 4:
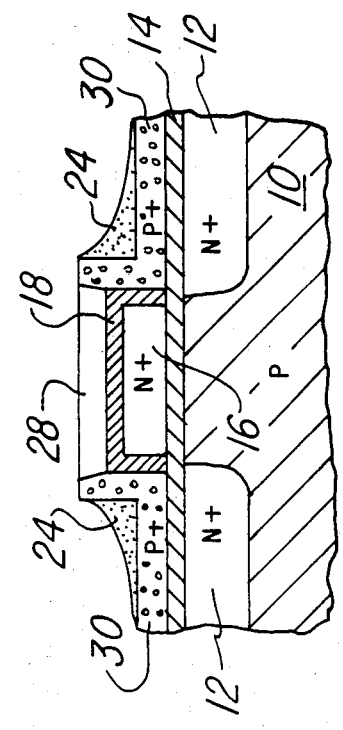

Referring to FIG. 3, the integrated circuit is then anisotropically etched in order to expose the polycrystalline silicon 20 directly above the gate region 16. This leaves sidewall regions 24 of doped silicate glass. It is important that the glass be etched so that none remains on the surface of the polycrystalline silicon 20 above the gate region 16. A protective layer, such as CVD oxide, is deposited, resulting in the structure shown at FIG. 3. The device is then heated, so that the boron from the silicate glass pockets 24 diffuses into the polysilicon 20 to create highly doped source and drain regions 30 as shown in FIG. 4. Directly above the gate region 16, the polysilicon layer does not receive extra dopant from the doped pockets 24, thereby leaving channel region 28. The cap oxide 26 and doped glass pockets 24 are then stripped away. The integrated circuit is then passivated and metallization and contacts laid down in a conventional manner.

It should be noted that with the method of the present invention, no boron doped glass remains remains behind after the self-aligned stacked CMOS structure has been fabricated. This eliminates mobile ion contamination during later processing steps, and failure modes caused by boron diffusion out of the silicate glass.

The present invention has been illustrated by the process steps described above, and it will become apparent to those skilled in the art that various modifications and alterations may be made thereto. For example, the stacked CMOs structure can be fabricated with the p-channel device in the substrate 10 and the n-channel device in the polysilicon layer 20. Dopant other than boron, such as phosphorus or arsenic, can be used in the doped glass layer 22. Such variations fall within the spirit of the present invention, the scope of which is defined by the appended claims.

What is claimed is:

1. A method for fabricating a self-aligned stacked CMOS structure, comprising the steps of:
    (a) forming source and drain regions having a first conductivity type in a substrate having a second conductivity type;

(b) forming an insulated gate region on an upper surface of the substrate;

(c) forming a layer of polycrystalline silicon over the substrate and the gate region;

(d) forming doped regions adjacent the polycrystalline layer above the source and drain regions; and (e) causing dopant from the doped regions to diffuse into the polycrystalline layer, wherein doped polycrystalline regions are formed above the source and drain regions, and wherein polycrystalline above the gate region is not doped by diffusion from the doped regions.

2. The method of claim 1, wherein the first conductivity type is n-type, and the second conductivity type is p-type.

3. The method of claim 1, wherein the first conductivity type is p-type, and the second conductivity type is n-type.

4. The method of claim 1, wherein the doped regions comprise boron doped silicate glass.

5. The method of claim 1, wherein the doped regions comprise phosphorus or arsenic doped silicate glass.

6. The method of claim 1, wherein step (d) comprises the steps of:

(f) forming a doped layer over the polycrystalline layer; and (g) anisotropically etching the doped layer until the polycrystalline layer above the gate region is exposed, wherein sidewall regions of the doped layer are left above the source and drain regions.

7. The method of claim 6, wherein the doped layer comprises boron doped glass.

8. The method of claim 1, further comprising the subsequent step of removing said doped regions after said step (e).

* * * * *